US 12,474,632 B2

(12) United States Patent
Custers et al.

(10) Patent No.: US 12,474,632 B2
(45) Date of Patent: Nov. 18, 2025

(54) PELLICLE FRAME FOR EUV LITHOGRAPHY

(71) Applicant: ASML NETHERLANDS B.V., Veldhoven (NL)

(72) Inventors: Kristof Custers, Hamont-Achel (BE); Ron Geeraard Catharina De Bruijn, Arendonk (BE); Matthias Kruizinga, Herten (NL); Lodewijk Alexander Schijvenaars, Oosterhout (NL)

(73) Assignee: ASML NETHERLANDS B.V., Veldhoven (NL)

(*) Notice: Subject to any disclaimer, the term of this patent is extended or adjusted under 35 U.S.C. 154(b) by 537 days.

(21) Appl. No.: 17/920,392

(22) PCT Filed: Mar. 25, 2021

(86) PCT No.: PCT/EP2021/057742
§ 371 (c)(1),
(2) Date: Oct. 20, 2022

(87) PCT Pub. No.: WO2021/213777
PCT Pub. Date: Oct. 28, 2021

(65) Prior Publication Data
US 2023/0259019 A1    Aug. 17, 2023

(30) Foreign Application Priority Data

Apr. 23, 2020    (EP) .................................... 20170977

(51) Int. Cl.
*G03F 1/64*     (2012.01)
*G03F 1/22*     (2012.01)

(52) U.S. Cl.
CPC . *G03F 1/64* (2013.01); *G03F 1/22* (2013.01)

(58) Field of Classification Search
CPC ..................................... G03F 1/62; G03F 1/64
See application file for complete search history.

(56) References Cited

U.S. PATENT DOCUMENTS 6,239,863 B1    5/2001   Catey et al.
10,539,886 B2   1/2020   Van Der Meulen et al.
(Continued)

FOREIGN PATENT DOCUMENTS

JP    11194481     7/1999
JP    2005/309129  11/2005
(Continued)

OTHER PUBLICATIONS

Machine translation of JP 11-194481 (no date) (Year: 0000).*
(Continued)

*Primary Examiner* — Amanda C. Walke
(74) *Attorney, Agent, or Firm* — Pillsbury Winthrop Shaw Pittman, LLP

(57) ABSTRACT

A pellicle frame includes: a first portion; and a plurality of second portions. The first portion is for connection to a border of a pellicle. The first portion includes a hollow and generally rectangular body. The plurality of second portions are for connection to a patterning device. The first portion and the plurality of second portions are all formed from a first material. Each of the second portions is connected to the first portion by a spring portion formed from the first material. Such a pellicle frame is advantageous since the first portion, the plurality of second portions and the spring portions are all formed from a same material.

22 Claims, 7 Drawing Sheets

(56) References Cited

U.S. PATENT DOCUMENTS

| | | |
|---|---|---|
| 11,320,731 B2 | 5/2022 | Van Zwol et al. |
| 11,635,681 B2 * | 4/2023 | Brouns .................... G03F 1/38 430/30 |
| 2012/0140199 A1 * | 6/2012 | Hotzel ...................... G03F 1/82 355/75 |
| 2016/0033860 A1 | 2/2016 | Wiley et al. |
| 2019/0107774 A1 | 4/2019 | Yanase |
| 2020/0064729 A1 | 2/2020 | Kohmural et al. |
| 2024/0295809 A1 * | 9/2024 | Fujimura ................. G03F 1/64 |

FOREIGN PATENT DOCUMENTS

| | | |
|---|---|---|
| JP | 2006/184442 | 7/2006 |
| JP | 2008/129453 | 6/2008 |
| JP | 2018536902 | 12/2018 |
| JP | 2019070745 | 5/2019 |
| JP | 2021500595 A * | 1/2021 |
| KR | 10-2019-0040445 | 4/2019 |
| KR | 20240082108 A * | 6/2024 |
| TW | 202011109 | 3/2020 |
| WO | 2019/081095 | 5/2019 |
| WO | 2020/173892 | 9/2020 |
| WO | WO-2023181869 A1 * | 9/2023 ............... G03F 1/64 |

OTHER PUBLICATIONS

International Search Report and Written Opinion mailed Jun. 16, 2021, issued in the corresponding International Application No. PCT/EP2021/057742.

Office Action issued in corresponding Japanese Patent Application No. 2022-564274, dated Dec. 9, 2024.

* cited by examiner

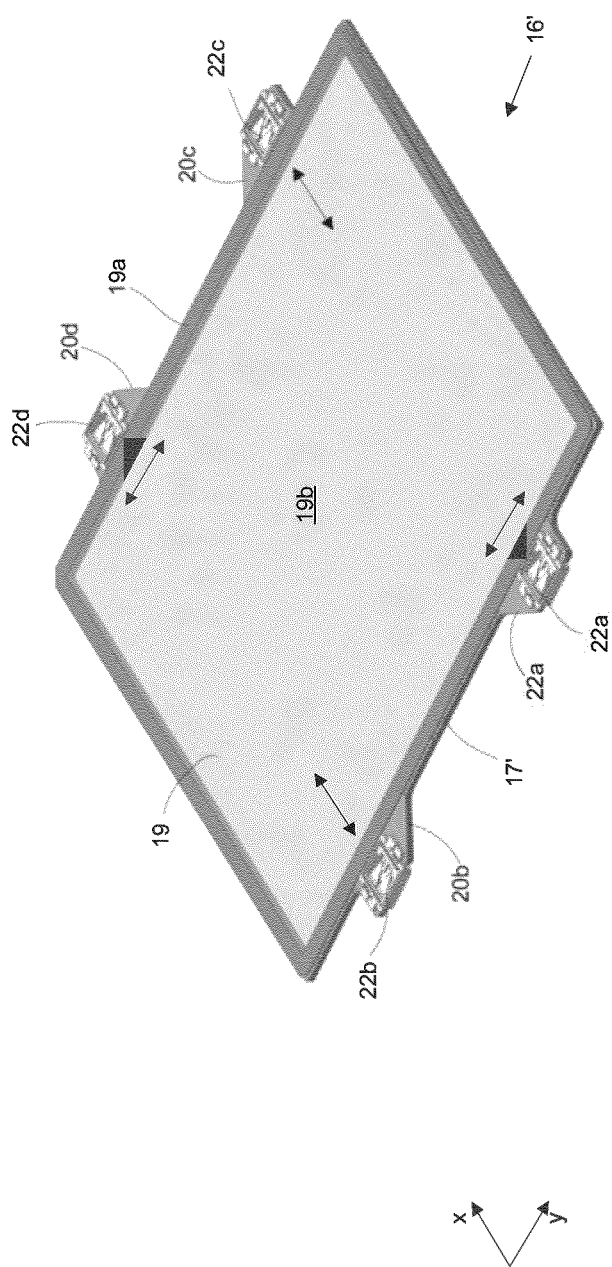
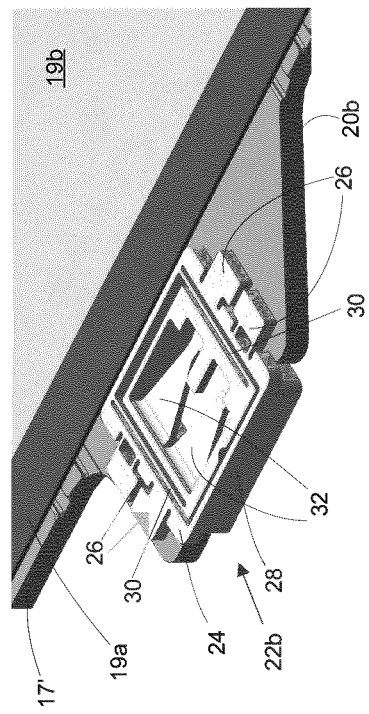
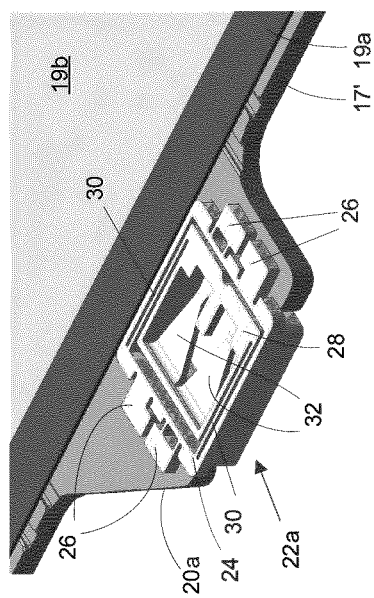
Fig. 3

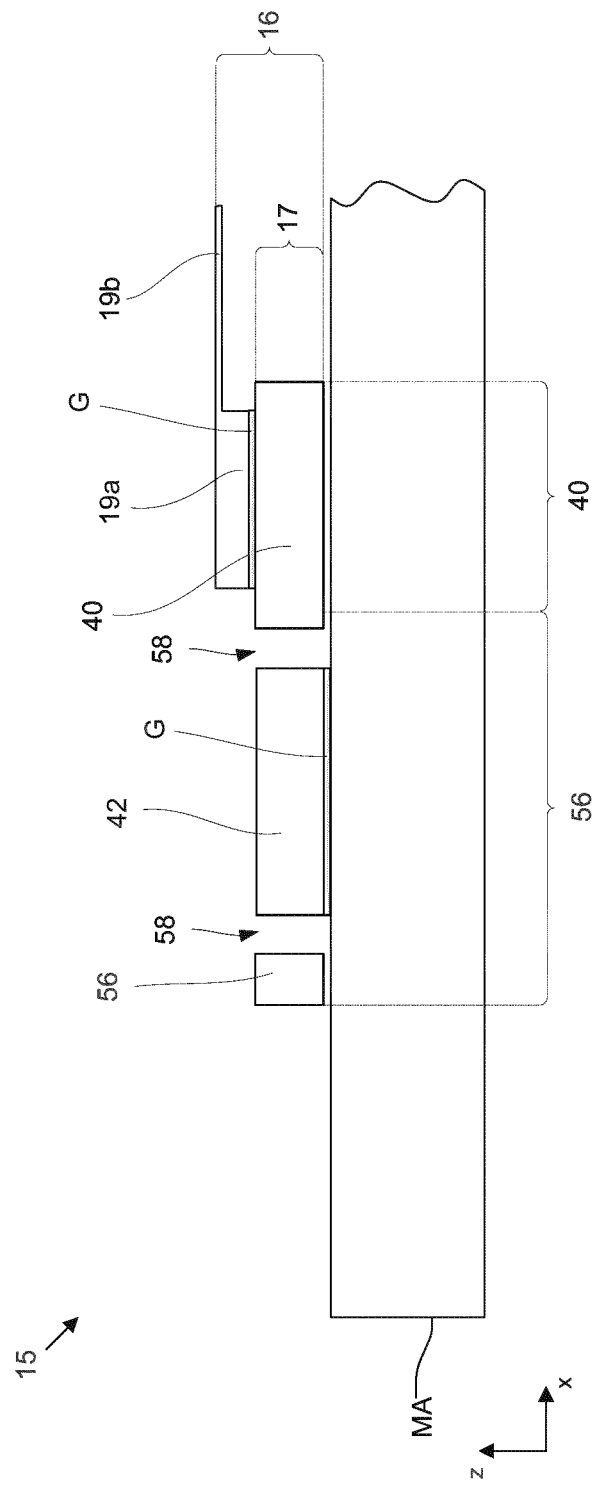

PELLICLE FRAME FOR EUV LITHOGRAPHY

CROSS-REFERENCE TO RELATED APPLICATIONS

This application is a U.S. national stage application of PCT Patent Application No. PCT/EP2021/057742, filed on Mar. 25, 2021, which application claims priority of European Patent Application No. 20170977.1 which was filed on 23 Apr. 2020, and which is incorporated herein in its entirety by reference.

FIELD

The present invention relates to a pellicle frame suitable for use within an extreme ultraviolet (EUV) lithographic apparatus. The pellicle frame may facilitate connection of a pellicle to a reticle or mask. The present invention also relates to a pellicle assembly comprising the pellicle frame and to a mask assembly comprising said pellicle assembly.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A patterning device (e.g., a mask) that is used to impart a pattern to a radiation beam in a lithographic apparatus may form part of a mask assembly. A mask assembly may include a pellicle that protects the patterning device from particle contamination. The pellicle may be supported by a pellicle frame.

It may be desirable to provide an apparatus that obviates or mitigates one or more problems associated with the prior art.

SUMMARY

According to a first aspect of the invention there is provided a pellicle frame comprising: a first portion for connection to a border of a pellicle, the first portion comprising a hollow and generally rectangular body; and a plurality of second portions for connection to a patterning device; wherein the first portion and the plurality of second portions are all formed from a first material; and wherein each of the second portions is connected to the first portion by a spring portion formed from the first material.

The pellicle frame according to the first aspect of the invention is advantageous since the first portion, the plurality of second portions and the spring portions are all formed from the same material, namely the first material. This significantly simplifies the manufacture of the pellicle frame. For example, all parts of the pellicle frame may be integrally formed together.

This is in contrast to existing arrangements whereby a first portion that is for connection to a border of a pellicle is formed from one material (for example silicon) and a plurality of second parts which are for connection to a patterning device are formed from another material (for example titanium or a titanium alloy). Such an existing arrangement is significantly more complicated to manufacture since parts must be made separately and then assembled together. In turn, this significantly increases the cost of manufacturing such an existing pellicle frame (relative to the pellicle frame according to the first aspect of the invention). This is particularly true since the assembly of these separate parts is not straight forward as a result of the rather strict requirements on a pellicle frame for use in an EUV lithographic apparatus.

First, it is important for the pellicle frame (and a resultant pellicle assembly comprising the pellicle frame) to be clean so as to reduce the risk of contaminating the patterning device (reticle) to which it will be attached in use. For example, it may be desirable to ensure that the number of particles on the pellicle frame is below a desired particle threshold (preferably no particles will be disposed on the pellicle frame). In order to achieve this, the component parts of the pellicle frame may be maintained in clean environments until they are assembled. The assembly may be achieved in a clean environment. These clean environments may be maintained under vacuum conditions. Maintaining a plurality of clean environments (or a clean environment of increased size) will increase the cost of manufacture. In addition, assembly within the clean environment is challenging.

Second, in use, the pellicle frame will be attached to a reticle that will be supported by a reticle stage. For lithographic apparatus referred to as scanners, wherein the patterning device and the wafer are synchronously scanned through an EUV radiation beam, the reticle stage, and the pellicle frame attached thereto, will be subject to significant accelerations. It is important that all parts of the moving mask assembly are connected sufficiently well such that they remain connected in spite of these large accelerations. For this reason it may be preferred to reduce the total number of parts which are connected together. The new pellicle frame according to the first aspect of the invention achieves this.

It will be appreciated that each spring portion may comprise a portion of the first material having a dimension that is smaller than the dimensions of the first portion and the plurality of second portions.

In some embodiments, the first material may have a coefficient of thermal expansion (CTE) that is <10*10$^{-6}$ K$^{-1}$, preferably <10$^{-6}$ K$^{-1}$ The first material may be elastic. The first material may be ductile. In some embodiments, the first material may have a Youngs modulus of greater than 100 GPa. In some embodiments, the first material may have a yield stress less than 1000 MPa, preferably less than 900 MPa. In some embodiments, the first material may have a density of less than 5000 kg/m$^3$, more preferably less than 1500 kg/m$^3$. The first material properties are chosen such as to ensure a reticle deformation in image area of 400 pm or less. The first material may be suitable for use in vacuum environment. The first material may be suitable for use in the environment within an EUV lithographic apparatus.

The first material may comprise titanium.

For example, the first material may be a titanium alloy. For example, the first material may comprise titanium grade 5. Titanium grade 5 may also be referred to as Ti6Al4V, Ti-6Al-4V or Ti 6-4. Titanium grade 5 comprises 6% aluminium (Al), 4% vanadium (V) and traces of iron and oxygen; the remainder comprises titanium.

The first material may comprise at least 50% titanium. The first material may comprise at least 70% titanium. The first material may comprise at least 85% titanium.

Titanium is suitable for use in vacuum environments and, in particular, it suitable for use in the environment within an EUV lithographic apparatus. In addition, titanium is sufficiently elastic to provide the spring portions and to ensure that the pellicle frame is not so brittle that it may break during use.

There may be four second portions, each second portion connected to the first portion by a spring portion.

Each of the four second portions may be proximate to a corner of the first portion.

Two of the second portions may be provided on one side of the hollow and generally rectangular body of the first portion and another two of the second portions may be provided on an opposite side of the hollow and generally rectangular body of the first portion.

Each of the plurality of second portions may comprise a generally cuboidal body such that in a main plane of the pellicle frame each of the second portions is rectangular.

Each of the second portions therefore provides a generally rectangular surface which can be adhered to a surface of a patterning device.

Each of the spring portions may be configured so as to allow for some relative movement of the first portion and the second portion in a movement direction.

Each of the spring portions may comprise a generally cuboidal body. One of the dimensions of the spring portions may be significantly smaller than the other two dimensions such that each spring portion is generally planar. In particular, a dimension of the spring portions in its movement direction may be significantly smaller than the other two dimensions of the spring portions.

In a plane of the pellicle frame each of the spring portions may comprise a portion of the first material extending in a connection direction from the first portion to one of the second portions, the spring portion having a smaller dimension in a movement direction which is in a plane of the pellicle frame and is perpendicular to the connection direction so as to allow for some relative movement of the second portion and the first portion in the movement direction.

That is, each spring portion is a relatively thin portion of the first material which extends from the first portion to one of the second portions in the connection direction.

In use, the movement and flexibility which is provided by the spring portions allows flexing of the pellicle frame relative to the patterning device which the second portions are connected to. This can accommodate differential thermal expansion of the patterning device, the pellicle frame and the pellicle. This is advantageous because it reduces potentially damaging thermal stresses arising in the pellicle frame (which may damage the pellicle) and the patterning device (which may distort the pattern being imaged onto the wafer). It also reduces the loads on the adhesives which connect the pellicle to the patterning device (i.e. an adhesive layer between the first portion of the pellicle frame and the pellicle; and an adhesive layer between each of the second portions of the pellicle frame and the patterning device).

Although each of the spring portions comprises a generally cuboidal body, the dimension of this body in the movement direction is significantly smaller than the other two dimensions. In particular, the dimensions of the spring portions are such that the spring portions allow for some relative movement of the second portion and the first portion in the movement direction. It will be appreciated that suitable dimensions to achieve this will, in general, be dependent on the elastic properties of the first material (for example titanium or a titanium alloy).

The dimensions of the spring portions in a direction perpendicular to the plane of the pellicle frame are preferably sufficiently large so as to prevent, or at least significantly reduce any relative movement between the first portion and the plurality of second portions out of the plane of the pellicle frame.

In general, each spring portion may have a different movement direction.

Each pair of diagonally opposed spring portions may have the same movement direction such that two spring portions have a first movement direction and two spring portions have a second movement direction.

Each of the spring portions may be configured so that its movement direction points generally towards a center of the first portion.

This is advantageous because it means that each spring portion allows the pellicle frame, and any attached pellicle, in the vicinity of each of the second portions (i.e. the positions where, in use, it connects to a patterning device) to move in a direction that passes through the center of the first potion. This allows the pellicle frame (and the pellicle assembly) to expand equally in all directions without rotating relative to a patterning device to which it is attached, which is beneficial. Therefore, with such an arrangement, if there is uniform heating of the pellicle frame (relative to the temperature of a patterning device to which it is attached), the orientation and central position of the pellicle frame relative to the patterning device would remain the same.

Each of the spring portions may be configured so that its connection direction extends through a central point on the second portion that it is connected to. In an embodiment one or more spring portions form a spring, for example a first spring portion and a second spring portion may form a spring. The spring ensures mechanical decoupling of the frame from the reticle, for example when the frame heats up and has a thermal distortion. The mechanical decoupling ensures that minimal forces and moments are applied to the reticle. The frame may be constrained with springs for example in four points on the reticle.

The spring may be a leaf spring, for example a single or a double leaf spring. Preferably the spring is a single leaf spring, such that the spring moment is substantially reduced and reticle deformation occurs rather in the z-direction than in the xy-plane of the reticle.

The springs may be oriented towards a thermal center of the frame. The thermal center is a point of the frame which has no displacement when a temperature change is applied. An advantage of the springs being oriented towards the thermal center is that the frame deformation, stresses and strains are symmetric around the thermal center. The springs may be rotated in the frame such that the thermal center of the frame is in the middle, overlapping a center of symmetry.

Each of the second portions may be disposed outside of the generally hollow rectangular body of the first portion.

The pellicle frame may further comprise a plurality of side protrusions from the hollow and generally rectangular body. Each side protrusion may be formed from the first material. Each side protrusion and the hollow and generally rectangular body may define an aperture and each of the plurality of second portions may be disposed in one of said apertures.

That is, each side protrusion together with the first portion forms a frame around one of the second portions (and its corresponding spring portion).

The side protrusions may be integrally formed with the first portion. Each side protrusion from the generally rectangular first portion may be generally of the form of a hollow triangle. A clearance gap may be provided between each second portion and the side protrusion and/or first portion. This clearance gap allows for some limited movement between each second portion and the first portion in a movement direction. However, the side protrusions may have sufficiently large dimensions so as to be substantially rigid. The side protrusions can therefore act as physical stops to limit the range of movement between each second portion and the first portion in the movement direction. Advantageously, this may prevent failure of the spring portions. There may be a risk of such failure during handling of the pellicle frame, for example during installation thereof into a pellicle assembly and/or a mask assembly.

According to a second aspect of the invention there is provided a pellicle assembly, comprising: the pellicle frame according to the first aspect of the invention; and a pellicle, the pellicle comprising: a border portion, which is hollow and generally rectangular; and a membrane bounded by the border portion; wherein the border portion of the pellicle is attached to the first portion of the pellicle frame.

The border portion of the pellicle may be attached to the hollow and generally rectangular body of the first portion of the pellicle frame.

The border portion of the pellicle may be formed from a second material which is different to the first material from which the pellicle frame is formed.

The border portion of the pellicle may be formed from silicon.

As known in the art, the pellicle may be formed by deposition of one or more thin layers of material on a generally rectangular silicon substrate. The silicon substrate supports the one or more thin layers during this stage of the construction of the pellicle. Once a desired or target thickness and composition of layers has been applied, a central portion of the silicon substrate is removed by etching (this may be referred to as back etching). A peripheral portion of the rectangular silicon substrate is not etched (or alternatively is etched to a lesser extent than the central portion). This peripheral portion forms the border portion of the final pellicle while the one or more thin layers form the membrane of the pellicle (which is bordered by the border portion).

Such a pellicle generally requires some support from a more rigid pellicle frame. The pellicle frame provides two functions: (a) it supports the pellicle and may also tension the pellicle membrane; and (b) it facilitates connection of the pellicle to a patterning device (reticle). In order to provide some flexibility to allow for different thermal expansion of the pellicle and the reticle over the range of operating temperatures that these components experience in use, it is desirable to select a material for the connection to the patterning device which is sufficiently elastic and which is suitable for use in the conditions within an EUV lithographic apparatus. One suitable material is titanium. Since a main, hollow rectangular part of the pellicle frame is generally adhered to the border portion, in known assemblies, this main, hollow rectangular part of the pellicle frame is formed from a material whose thermal properties generally match those of the border portion of the pellicle. For example, generally silicon is used. It is for these reasons that known pellicle frames comprise a main silicon body which is glued to the pellicle and four titanium attachment mechanisms that are glued to the side of this main body.

Owing to the very different thermal properties of silicon and titanium (titanium has a thermal expansion coefficient that is approximately four times that of silicon) there is a significant prejudice in the art against using a material for the main body of the pellicle frame that has different thermal properties to those of silicon (such as, for example, titanium). The reason for this is that as the temperature of the pellicle assembly varies the differential thermal expansion of the frame and the border would cause the pellicle assembly to warp or buckle. In turn, this may stress the patterning device, which may lead to imaging errors such as increased overlay. However, surprisingly, the inventors have found that when using the new pellicle frame overlay is no worse than when using the known pellicle frame. Therefore, the new pellicle frame provides a simpler and less costly arrangement without compromising on imaging performance.

The border portion of the pellicle may be attached to the first portion of the pellicle frame by an adhesive.

The adhesive may be a poly(methyl methacrylate) based adhesive.

Alternatively, the adhesive may be an epoxy adhesive.

According to a third aspect of the invention there is provided a mask assembly, comprising: a pellicle assembly according to the second aspect of the invention; and a patterning device, wherein the plurality of second portions of the pellicle frame are attached to the patterning device.

The mask assembly according to the third aspect of the invention is particularly advantageous over known arrangements which typically use intermediate fixing members (known as studs) which are affixed to the patterning device and which engage with the pellicle assembly, as now discussed.

The mask assembly according to the third aspect of the invention comprises fewer components than a mask assembly which uses intermediary fixing members such as studs (affixed to a patterning device) and engagement mechanisms (provided on the pellicle assembly) to engage with the intermediary fixing members (studs). Therefore, advantageously, the mask assembly according to the third aspect of the invention may be relatively simple to manufacture. The lower number of components and the simpler manufacturing procedure may result in a lower cost of manufacture.

This is particularly true since the assembly of a mask assembly is not straight forward as a result of the rather strict requirements on a mask assembly for use in an EUV lithographic apparatus.

First, it is important for the mask assembly to be clean so as to reduce the risk of contaminating the patterning device (reticle). For example, it may be desirable to ensure that the number of particles on the mask assembly is below a desired particle threshold (preferably no particles will be disposed on the mask assembly). In order to achieve this, the component parts of the mask assembly may be maintained in clean environments until they are assembled. The assembly may be achieved in a clean environment. These clean environments may be maintained under vacuum conditions. Maintaining a plurality of clean environments (or a clean environment of increased size) will increase the cost of manufacture. In addition, assembly within the clean environment is challenging.

Second, in use, the mask assembly will be supported by a reticle stage. For lithographic apparatus referred to as scanners, wherein the patterning device and the wafer are synchronously scanned through an EUV radiation beam, the reticle stage, and the pellicle frame attached thereto, will be subject to significant accelerations. It is important that all parts of the moving mask assembly are connected sufficiently well such that they remain connected in spite of these large accelerations. For this reason it may be preferred to reduce the total number of parts which are connected together. The new mask assembly according to the third aspect of the invention achieves this.

It is estimated that there is a significant reduction in the cost of manufacturing the mask assembly according to the third aspect of the invention relative to the cost of manufacturing a known mask assembly. For example, the cost of manufacturing a known mask assembly may be of the order of a factor of 10 greater than the cost of manufacturing a mask assembly according to the third aspect of the invention.

In addition, the significantly reduced complexity of the mask assembly and its manufacture result in fewer components, fewer handling steps during a process of manufacturing the mask assembly and furthermore these handling steps may be less involved. As a result, there is less risk of the final mask assembly having particles or debris on it. This is beneficial since such particles can cause imaging errors or defects.

In some embodiments, the separation between the pellicle and the patterning device may, for example, be approximately between 1 mm and 10 mm, for example between 1 mm and 5 mm, for example between 2 mm and 2.5 mm.

The plurality of second portions of the pellicle frame may be attached to the patterning device by an adhesive.

The adhesive may be a poly(methyl methacrylate) based adhesive.

Material characteristics of the PMMA glue, in particular the elasticity of the PMMA glue and the dimensions in which the PMMA glue may be applied, result in a relatively low deformation of the patterning device due to curing of the PMMA glue (as compared to other glues). In contrast, if the pellicle frame were directly affixed to the patterning device using the other glues, deformation of the patterning device due to curing of the other glues may be significantly larger, resulting in errors in patterns projected onto a substrate by a lithographic apparatus.

PMMA glue is more easily removable, and relatively more elastic, than, for example, epoxy glue. Advantageously, this may enable a pellicle assembly, forming part of the mask assembly according to the third aspect of the invention, to be replaced more easily.

Alternatively, the adhesive may be an epoxy adhesive.

It will be appreciated that one or more aspects or features described above or referred to in the following description may be combined with one or more other aspects or features.

BRIEF DESCRIPTION OF THE DRAWINGS

Embodiments of the invention will now be described, by way of example only, with reference to the accompanying schematic drawings, in which:

FIG. 3 is a perspective view of a known type of pellicle assembly;

FIG. 7 is a schematic cross section of a portion of a new mask assembly comprising the new pellicle frame shown in FIG. 6.

DETAILED DESCRIPTION

Figure 1:
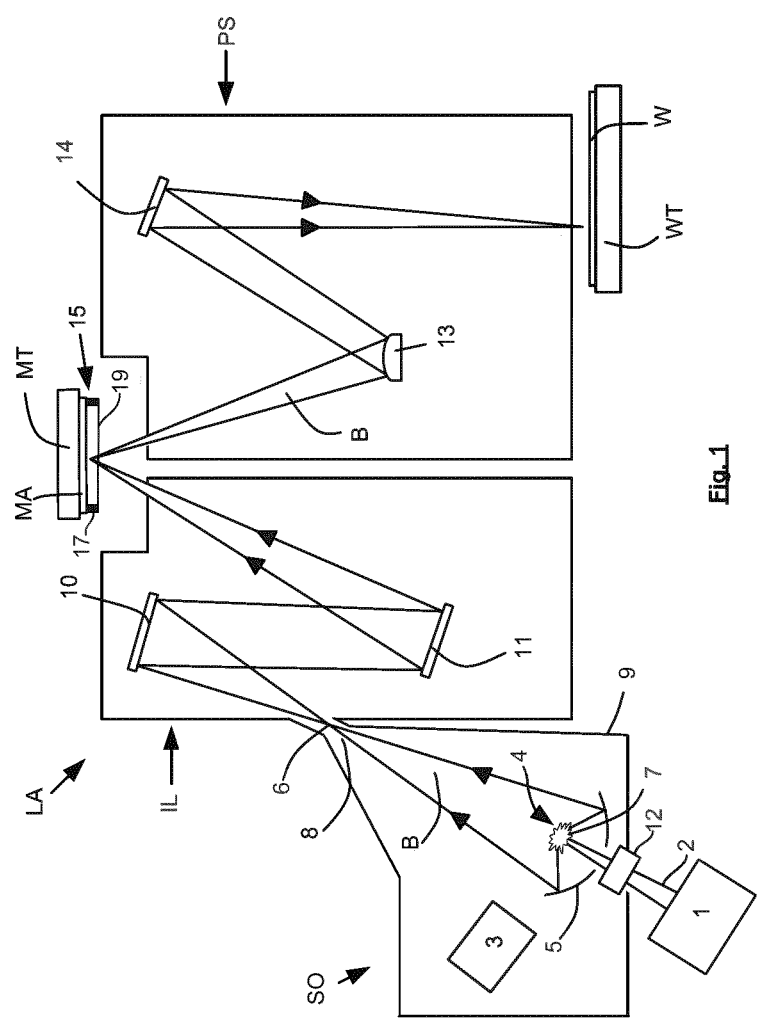
FIG. 1 is a schematic illustration of a lithographic system comprising a lithographic apparatus and a radiation source.

FIG. 1 shows a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a mask assembly 15 including a patterning device MA (e.g., a mask), a projection system PS and a substrate table WT configured to support a substrate W. The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g., hydrogen) may be provided in the radiation source SO. A vacuum may be provided in the illumination system IL and/or the projection system PS. A small amount of gas (e.g., hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a CO2 laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g., in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g., EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source SO.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the mask assembly 15 held by the support structure MT. The mask assembly 15 includes a patterning device MA and a pellicle 19, which is held in place by a pellicle frame 17. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors that are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g., six mirrors).

The lithographic apparatus may, for example, be used in a scan mode, wherein the support structure (e.g., mask table) MT and the substrate table WT are scanned synchronously while a pattern imparted to the radiation beam is projected onto a substrate W (i.e., a dynamic exposure). The velocity and direction of the substrate table WT relative to the support structure (e.g., mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatus.

As was described briefly above, the mask assembly 15 includes a pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. The pellicle 19 comprises a thin film that is substantially transparent to EUV radiation (although it will absorb a small amount of EUV radiation). By EUV transparent pellicle or a film substantially transparent for EUV radiation herein is meant that the pellicle 19 is transmissive for at least 65% of the EUV radiation, preferably at least 80% and more preferably at least 90% of the EUV radiation. The pellicle 19 acts to protect the patterning device MA from particle contamination.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and therefore the pattern that is transferred to the substrate W. The pellicle 19 advantageously provides a barrier between the patterning device MA and the environment in the lithographic apparatus LA in order to prevent particles from being deposited on the patterning device MA.

The pellicle 19 is positioned at a distance from the patterning device MA that is sufficient that any particles that are incident upon the surface of the pellicle 19 are not in a field plane of the lithographic apparatus LA. This separation between the pellicle 19 and the patterning device MA acts to reduce the extent to which any particles on the surface of the pellicle 19 impart a pattern to the radiation beam B that is imaged onto the substrate W. It will be appreciated that where a particle is present in the beam of radiation B, but at a position that is not in a field plane of the beam of radiation B (i.e., not at the surface of the patterning device MA), then any image of the particle will not be in focus at the surface of the substrate W. In the absence of other considerations it may be desirable to position the pellicle 19 a considerable distance away from the patterning device MA. However, in practice the space which is available in the lithographic apparatus LA to accommodate the pellicle is limited due to the presence of other components. In some embodiments, the separation between the pellicle 19 and the patterning device MA may, for example, be approximately between 1 mm and 10 mm, for example between 1 mm and 5 mm, more preferably between 2 mm and 2.5 mm.

A mask assembly may be prepared for use in a lithographic apparatus by attaching a pellicle to a pellicle frame and by attaching the pellicle frame to a patterning device. A mask assembly comprising a patterning device MA and a pellicle supported adjacent to the patterning device by a pellicle frame may be prepared remotely from a lithographic apparatus LA and the mask assembly may be transported to the lithographic apparatus LA for use in the lithographic apparatus LA. For example, a pellicle frame supporting a pellicle may be attached to a patterning device, so as to form a mask assembly, at a site at which a pattern is imparted onto the patterning device. The mask assembly may then be transported to a separate site at which a lithographic apparatus LA is situated and the mask assembly may be provided to the lithographic apparatus LA for use in the lithographic apparatus LA.

A mask assembly in which a pellicle is held in place by a pellicle frame may be delicate and transport of the mask assembly may risk damage to the pellicle. Assembling a mask assembly in a separate environment to a lithographic apparatus LA may additionally result in the mask assembly being exposed to a variety of pressure conditions. For example, a mask assembly may be transported to a lithographic apparatus under ambient pressure conditions. The mask assembly may then be loaded into the lithographic apparatus LA via a load lock which is pumped to vacuum pressure conditions. Changes in the pressure conditions to which a mask assembly is exposed may cause a pressure difference to exist across a pellicle which may cause the pellicle to bend and may risk damage to the pellicle. In an embodiment, a lithographic system may comprise a lithographic apparatus LA connected to a pellicle frame attachment apparatus. Where this is the case a mask assembly comprising a mask and pellicle may be transferred directly from the pellicle frame attachment apparatus to the lithographic apparatus whilst remaining in a controlled environment (e.g. a vacuum environment).

The manufacture of a mask assembly is a complicated process and, consequently, the cost of producing a mask assembly is very high. Embodiments of the present invention relate to a new pellicle frame which reduces the complexity of the mask assembly and its manufacture significantly. In turn, this results in a reduction in cost of the order of a factor of 10. In addition, the significantly reduced complexity of the mask assembly and its manufacture result in fewer components, fewer handling steps during a process of manufacturing the mask assembly and furthermore these handling steps may be less involved. As a result, there is less risk of the final mask assembly having particles or debris on it. This is beneficial since such particles can cause imaging errors or defects. In order to better appreciate the advantages of the new pellicle frame (and a pellicle assembly and mask assembly using the new pellicle frame) it is useful to consider first the existing known arrangement and manufacture process, which will therefore now be described with reference to FIGS. 2 to 4.

Figure 2:
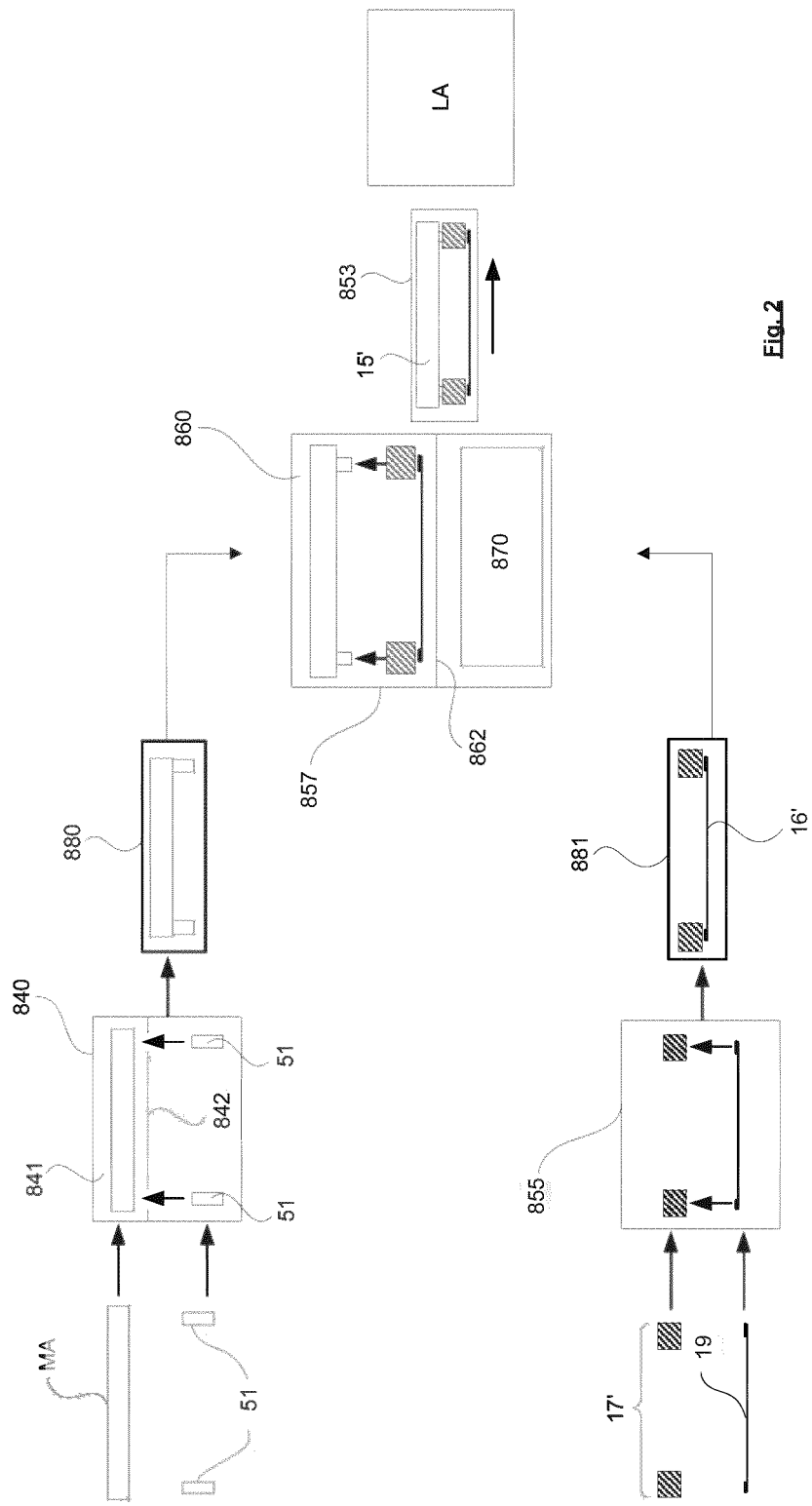
FIG. 2 is a schematic illustration of various apparatuses and a lithographic apparatus according to embodiments of the invention.

FIG. 2 is a schematic illustration of known apparatus suitable for assembling a known type of mask assembly 15' and transferring the mask assembly to a lithographic apparatus LA. FIG. 2 depicts a pellicle attachment apparatus 855 which may be used to attach a pellicle 19 to a known pellicle frame 17', and a pellicle assembly transport device 881 which may be used to transport the pellicle assembly 16'. In addition a stud attachment apparatus 840 is depicted, which may be used to attach studs 51 to a patterning device MA. The studs 51 allow releasable attachment of the pellicle frame 17' (and pellicle 19 supported thereby) to the patterning device MA. A mask transport device 880 which may be used to transport the mask with attached studs is also depicted. A pellicle frame attachment apparatus 857 which may be used to attach a pellicle frame 17' (and pellicle 19) to a patterning device MA, thereby forming a mask assembly 15', is also depicted. A mask assembly transport device 853 which may be used to transport the mask assembly 15' from the pellicle frame attachment apparatus 857 to the lithographic apparatus LA is also shown.

The pellicle attachment apparatus 855 may be situated at a different site from the site at which the lithographic apparatus is situated. The stud attachment apparatus 840 may be situated at a different site from the site at which the lithographic apparatus LA is situated. Alternatively, either or both of the pellicle attachment apparatus 855 and the stud attachment apparatus 840 may be located at the same site as the site at which the lithographic apparatus LA is situated (e.g. in a lithographic fab).

The pellicle attachment apparatus 855 receives a pellicle 19, a known pellicle frame 17' and engagement mechanisms (not illustrated). The pellicle 19 and known pellicle frame 17' may be manually placed in the pellicle attachment apparatus 855. Glue is dispensed at engagement mechanism receiving openings in the known pellicle frame 17' (e.g. locations described further below with reference to FIGS. 3 and 4). Glue dispensing may be manual, or may be automated (or partially automated).

The engagement mechanisms and the known pellicle frame 17' are aligned relative to each other (e.g. using an optical alignment apparatus), and the engagement mechanisms are then inserted into the openings in the known pellicle frame 17'.

Glue is also dispensed onto the known pellicle frame 17' (e.g. at spaced apart locations around the known pellicle frame 17'). Glue dispensing may be manual, or may be automated (or partially automated). An optical alignment system is used to align the pellicle 19 relative to the known pellicle frame 17', and the pellicle is then pressed against the known pellicle frame 17'.

The pellicle 19 may be manipulated by a pellicle manipulator which forms part of the pellicle attachment apparatus 855. The pellicle manipulator may comprise means for tensioning the pellicle 19. The pellicle manipulator may tension the pellicle 19 and hold the pellicle 19 against the known pellicle frame 17' at room temperature for a period of time sufficient to allow the glue to cure, thereby securing the pellicle 19 to the known pellicle frame 17'. The pressure on the pellicle 19 is then removed. Additional curing of the glue at an elevated temperature is then performed using a curing oven (which may form part of the pellicle attachment apparatus 855). This will also cure glue which attaches the engagement mechanisms to the known pellicle frame 17'. In an alternative approach, some heating may be applied to cure the glue when the pellicle 19 is being held against the known pellicle frame 17' (instead of allowing curing to proceed at room temperature).

Glue may be provided by a glue dispenser. The glue dispenser may form part of the pellicle attachment apparatus 855.

The resulting known pellicle assembly 16' is inspected using a particle inspection tool. The particle inspection tool may form part of the pellicle attachment apparatus 855 (or may be a separate tool). The particle inspection tool may be configured to inspect for particles disposed on the pellicle 19 and/or the known pellicle frame 17'. The particle inspection tool may, for example, reject a known pellicle assembly 16' which has a number of particles which is greater than a given particle threshold. The particle inspection tool may also be used to inspect a pellicle 19 and/or a known pellicle frame 17' before the pellicle and pellicle frame are glued together.

The pellicle attachment apparatus 855 may be configured, following inspection, to seal the known pellicle assembly 16' in a pellicle assembly transport device 881 (a sealed box). As depicted, the pellicle assembly transport device 881 may be arranged to hold the pellicle assembly in an orientation in which the pellicle 19 is below the known pellicle frame 17'. Because the transport device 881 is sealed, the known pellicle assembly can be transported without the known pellicle assembly 16' being contaminated. The known pellicle assembly 16' may be transported in the transport device 881 to a pellicle frame attachment apparatus 857.

The pellicle attachment apparatus 855 may include a clean environment so as to reduce the number of particles inside the sealed environment, thereby reducing the number or particles which may be deposited on the pellicle 19. The pellicle attachment apparatus 855 may, for example, be situated at a site at which pellicles are manufactured. A pellicle 19 may be provided to the pellicle attachment apparatus 855 directly from a pellicle manufacturing tool (not shown) in which the pellicle 19 is manufactured. A pellicle 19 may, for example, be provided to the pellicle attachment apparatus 855 from a pellicle manufacturing tool whilst keeping the pellicle 19 inside a clean environment. This may reduce the chance of a pellicle 19 from being contaminated or damaged before being provided to the pellicle attachment apparatus 855. The clean environment may, for example, be a sealed environment (i.e. fully isolated from an external environment). The sealed environment may be pumped so as to maintain a vacuum in the sealed environment.

The attachment of the pellicle 19 to the known pellicle frame 17' may be controlled so as to achieve a desirable tension in the pellicle 19. For example, the tension in the pellicle 19 may be measured during or after attachment of the pellicle 19 to the known pellicle frame 17' and the tension may be adjusted in response to the measurement in order to achieve a desirable tension in the pellicle 19. The tension in the pellicle 19 may be maintained, for example, by applying an outward force to components of the known pellicle frame 17' so as to stretch the pellicle 19. Tension in the pellicle 19 may for example be maintained by using differences in thermal expansion coefficients between the pellicle frame and the pellicle.

The patterning device (which may be referred to as a mask) MA may be provided with protrusions which are received by engagement mechanisms (e.g. as described further below with reference to FIGS. 3 and 4). The patterning device may for instance receive four protrusions (referred to herein as studs). As depicted in FIG. 2, the stud attachment apparatus 840 may be used to attach studs 51 to the patterning device MA.

The studs 51 and the patterning device MA may be manually placed in the stud attachment apparatus 840. The patterning device MA may be held in a controlled environment 841 which is separated from the rest of the stud attachment apparatus 840. Separation may be provided by a partition 842 with openings through which the studs 51 may project in order to contact the patterning device MA. The controlled environment 841 may be held at a higher pressure than other parts of the stud attachment apparatus 840 (e.g. by delivering gas through an outlet in the controlled environment). This will inhibit or prevent passage of contamination particles into the controlled environment 841 from other parts of the stud attachment apparatus.

The stud attachment apparatus 840 may include a stud manipulator (not depicted), such as a robot or actuators for accurately placing the studs. An example of a suitable actuator for placing studs onto the patterning device is a Lorentz actuator (not depicted). The stud attachment apparatus 840 may also include a device for automatically providing a given amount of glue or adhesive to the stud surface to be attached to the patterning device MA. Applying a glue or adhesive may also be done manually. Contamination of the patterning device MA by contaminants from the glue or adhesive is prevented or reduced by a flow of air from the controlled environment 841 above the partition 842 to below the partition (the flow of air is caused by the pressure above the partition being higher than the pressure below the partition).

The stud attachment apparatus 840 may further include an optical alignment system which aligns the studs with respect to alignment markers present on the reticle in order to accurately position the studs. For example, the alignment markers conventionally provided on the patterning device MA and used for pattern alignment may also be used for aligning the studs.

The stud attachment apparatus may include a support structure movable in the X-Y-Z and Rz directions for adjusting the position of the patterning device MA. The position of the support structure holding the patterning device MA may be adjustable manually by means of coarse and fine mechanical adjusting devices, or using automated (or semi-automated) actuators or any other type of devices suitable for alignment and positioning which are coupled to the patterning device table.

Once the studs 51 and the patterning device MA have been aligned, the studs 51 are then pressed against the patterning device MA. The studs 51 may be held against the patterning device MA at room temperature for a period of time which is sufficient to allow the glue to cure, thereby securing the studs 51 to the mask MA. Alternatively, the studs 51 may be heated in order to accelerate curing of the glue. Additional curing of the glue at an elevated temperature may then be performed using a curing oven (which may form part of the stud attachment apparatus 840).

Glue may be provided by a glue dispenser. The glue dispenser may form part of the stud attachment apparatus 840.

The patterning device MA and studs 51 may be inspected using a particle inspection tool (which may form part of the stud attachment apparatus 840).

The stud attachment apparatus 840 seals the patterning device MA and studs 51 in a mask transport device 880 (a sealed box). Because the mask transport device 880 is sealed, the patterning device MA and studs 51 can be transported without the mask MA being contaminated. The patterning device MA and studs may be transported in the mask transport device 880 to the pellicle frame attachment apparatus 857.

The mask MA may be provided to the stud attachment apparatus 840 in a sealed box (to reduce the risk of contamination). The box may remain sealed until just before the studs 51 are to be attached to the patterning device MA, thereby minimizing the time during which contamination could travel to the mask MA.

The controlled environment 841 of the stud attachment apparatus 840 may be provided in part by a housing which subsequently forms part of the patterning device MA transport device 880 (a sealed box). The housing may form walls and a roof of the mask transport device 880, with a floor of the mask transport device 880 being formed by a plate that is fitted after the studs 51 have been attached (e.g. immediately afterwards). Using the housing in this way may assist in preventing contamination from being incident upon the patterning device MA. The housing may comprise a cover of a pod. The mask table of the stud attachment apparatus 840 may be configured to receive the housing.

Similarly, the pellicle attachment apparatus 855 may also be formed in part by a housing that subsequently forms part of the pellicle assembly transport device 881.

The known pellicle assembly 16' in the pellicle assembly transport device 881 and the patterning device MA (and studs 51) in the mask transport device 880 are both transported to the pellicle frame attachment apparatus 857. The pellicle frame attachment apparatus 857 may be provided in a fab in which one or more lithographic apparatus are also provided.

The pellicle frame attachment apparatus 857 is configured to attach the known pellicle frame 17' of the known pellicle assembly 16' to the studs 51 on the patterning device MA so as to form a mask assembly 15. The pellicle frame attachment apparatus 857 may include a controlled environment 860 which is separated from the rest of the pellicle frame attachment apparatus 857. Separation may be provided by a partition 862 with openings through which manipulators extend (not shown in FIG. 2). The manipulators may be operated by a control system 870 (described further below). The controlled environment 860 may be maintained as a clean environment so as to reduce the number of particles inside the controlled environment, thereby reducing the number of particles which may be deposited on the known mask assembly 15'. The controlled environment 860 may be held at a higher pressure than other parts of the pellicle frame attachment apparatus 857 (e.g. by delivering gas through an outlet in the controlled environment 860). This will inhibit or prevent passage of contamination particles into the controlled environment 860 from other parts of the pellicle frame attachment apparatus 857.

The known mask assembly 15' which is assembled by the pellicle frame attachment apparatus 857 is transported from the pellicle frame attachment apparatus 857 to the lithographic apparatus LA in a mask assembly transport device 853. The mask assembly transport device 853 may comprise a sealed and clean environment in which the known mask assembly 15' is transported. This reduces the chances of the known mask assembly 15' being contaminated or damaged during transport of the known mask assembly 15'. The sealed and clean environment may, for example, be pumped to a vacuum.

The pellicle frame attachment apparatus 857 is used to mount the known pellicle assembly 16' to the patterning device MA. The pellicle frame attachment apparatus 857 comprises manipulators arranged to manipulate engagement mechanisms of the pellicle frame 17 (as described further below).

The patterning device MA may, for example, be provided with alignment marks. The known pellicle frame 17' may be positioned relative to the alignment marks on the patterning device MA. Aligning the pellicle frame 17 relative to alignment marks on the patterning device MA may advantageously increase the accuracy with which the known pellicle frame 17' is positioned on the patterning device MA during attachment of the known pellicle frame 17' to the patterning device MA.

The pellicle frame attachment apparatus 857 may include a particle inspection tool (not shown). The particle inspection tool may be configured to inspect the known mask assembly 15' for particles disposed on the known mask assembly 15'. The particle inspection tool may, for example, reject known mask assemblies 15' which have a number of particles disposed on them which is greater than a given particle threshold.

The pellicle frame attachment apparatus 857 may include a pattern inspection system which inspects the pattern on the patterning device MA for any defects. The pattern inspection system may inspect the pattern on the patterning device MA before and/or after the known pellicle frame 17' is attached to the patterning device MA.

The lithographic apparatus LA may include components which are configured to receive a known mask assembly 15' from the mask assembly transport device 853 and load the known mask assembly 15' onto a support structure MT of the lithographic apparatus LA.

The known pellicle assembly 16' may be attached to a patterning device MA so as to form a known mask assembly 15' under vacuum conditions in the pellicle frame attachment apparatus 857. The known mask assembly 15' may subsequently be transported to the lithographic apparatus LA under vacuum conditions by the mask assembly transport device 853 and may be held under vacuum conditions in the lithographic apparatus LA. The known mask assembly 15' may therefore be exposed to approximately the same pressure conditions throughout its assembly in the pellicle frame attachment apparatus 857 and use in the lithographic apparatus LA. This advantageously reduces any pressure changes to which the known mask assembly 15' is exposed and therefore reduces any pressure differences which may develop across the pellicle 19.

The patterning device MA and/or the pellicle 19 may be inspected for particles and/or defects in the pellicle frame attachment apparatus 857 whilst the components are held in a vacuum. The patterning device MA and/or the pellicle 19 are therefore advantageously inspected under similar pressure conditions to those to which they are exposed during use in the lithographic apparatus LA. This is advantageous since any particles which may be deposited onto patterning device MA and/or the pellicle during pumping down to vacuum conditions may be detected in the pellicle frame attachment apparatus 857.

It will be noted that the patterned side of the patterning device MA is directed downwards during the various operations that are depicted in FIG. 2. Keeping the patterned side of the patterning device MA facing downwards is advantageous because this reduces the likelihood of a contamination particle being incident upon the pattern. Larger contamination particles tend to fall downwards due to gravity and thus will be incident upon the opposite side of the mask. Smaller contamination particles are less influenced by gravity and may instead be influenced by other transport physics. The apparatus may include devices intended to address this. For example, the apparatus may include an ionizer to remove static charges and thereby reduce the risk of electrostatics causing particles to become attached to the pellicle.

Figure 4:
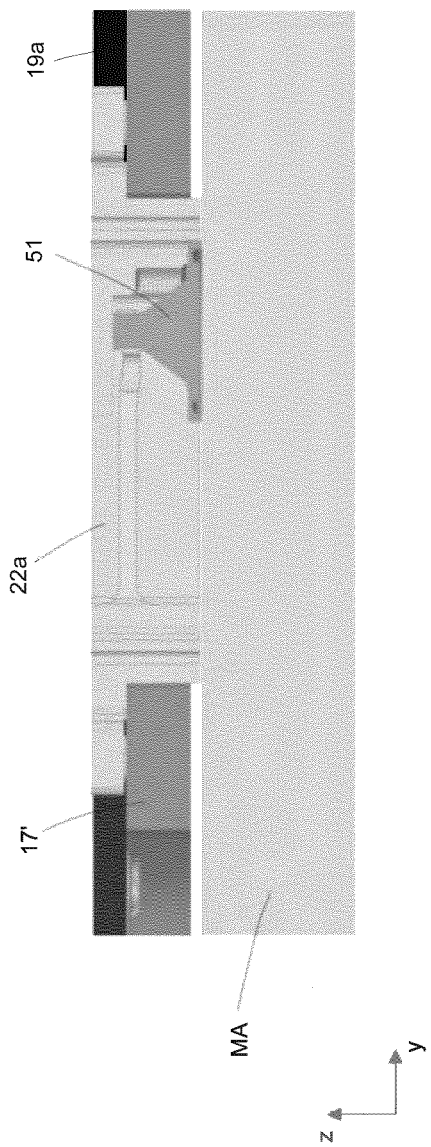
FIG. 4 is a schematic cross sectional view of part of a known mask assembly comprising the pellicle assembly of FIG. 3.

The known pellicle assembly 16' is illustrated in FIG. 3 and a known mask assembly comprising this known pellicle assembly 16' is illustrated in FIG. 4.

The known pellicle assembly 16' shown in FIG. 3 comprises a pellicle 19 and a known pellicle frame 17'. The pellicle 19 comprises a border portion 19a and a membrane 19b. The border portion 19a is hollow and generally rectangular and surrounds the membrane 19b, which is bounded by the border portion 19a. The border portion 19a may be formed from silicon.

The known pellicle frame 17' comprises a hollow and generally rectangular body that is provided with four protrusions 20a-20d that extend from the generally rectangular body in a main plane of the known pellicle frame 17'. The four protrusions 20a-20d are generally trapezoidal. Two of the protrusions 20a-20b protrude from one side of the generally rectangular body and the other two of the protrusions 20c-20d protrude from an opposite side of the generally rectangular body. The generally rectangular body and the four protrusions 20a-20d are integrally formed and are formed from silicon.

The known pellicle frame 17' is provided with four engagement mechanisms 22a-22d. Each of the four protrusions 20a-20d defines a recess which receives one of the engagement mechanisms 22a-22d.

Each engagement mechanism 22a-22d is configured to engage a protrusion 24 (which may for example be referred to as a stud 51) which extends from a patterning device MA (as shown rather schematically in FIG. 4).

The pellicle 19 is attached to the known pellicle frame 17'. In particular, the border portion 19a of the pellicle 19 is attached to the generally rectangular body of the known pellicle frame 17'. The border portion 19a of the pellicle 19 may, for example, be glued to the known pellicle frame 17'.

The protrusions 51 which are received by the engagement mechanisms 22a-22d are located on the front surface of the patterning device MA.

FIG. 3 depicts four engagement mechanisms 22a-22d secured to a pellicle frame 17. All four engagement mechanisms 22a-22d are configured to allow engagement to be achieved between the engagement mechanisms 22a-22d and protrusions 51 (not depicted) via movement in the y-direction.

Each engagement mechanism 22a-22d comprises a generally square outer portion 24 which is fixed (for example glued) into the recess defined by one of the protrusions 20a-20b of the pellicle frame 17. Each engagement mechanism 220a-22d is provided on the outer portion 24 with flanges 26 (which may be referred to as tabs 26) and facilitate engagement and alignment between the engagement mechanisms 22a-22d and the known pellicle frame 17'. In addition, each engagement mechanism 22a-22d comprises a generally square inner portion 28 (within the outer portion 24) which engages with the protrusions 51 on the patterning device MA. The inner portion 28 is connected to, and supported by, the outer portion 24 via two arms 30. These two arms 30 allow movement/flexibility in either the x-direction of the y-direction. Two engagement mechanisms 22a, 22d are configured to allow for movement in the y-direction (i.e. provide flexibility or compliance in the y-direction). Two engagement mechanisms 22b, 22c are configured to allow for movement in the x-direction (i.e. provide flexibility or compliance in the x-direction).

Although the details will not be described here, the inner portion 28 of each is engagement mechanism 22a-22d with engagement arms 32 that can be flexed out of a main plane of the engagement mechanism 22a-22d by an actuating force to allow insertion of a distal end of one of the protrusions 51. Once the protrusion 51 is in place, the actuating force is removed and the protrusion 51 remains captive in the engagement mechanism 22a-22d. This requires manipulator to be provided within the pellicle frame attachment apparatus 857 which comprise several independently movable arms. In general, for each engagement mechanism 22a-22d, at least two arms are required to clasp the engagement mechanism 22a-22d while a at least a third arm is required to apply the actuating force to the engagement arms 32. The provision of four such actuators (one for each engagement mechanism 22a-22d) that can operate in a clean environment is very challenging.

FIG. 4 depicts in cross-section one engagement mechanism 22a along with a protrusion 51 which projects from a patterning device MA. The protrusion 51, which may be referred to as a stud, may for example be glued to the patterning device MA or may be attached by other bonding means (optical contacting, magnetic or van der Waals forces, etc.). The protrusions 51 are formed from a material comprising titanium.

Figure 5:
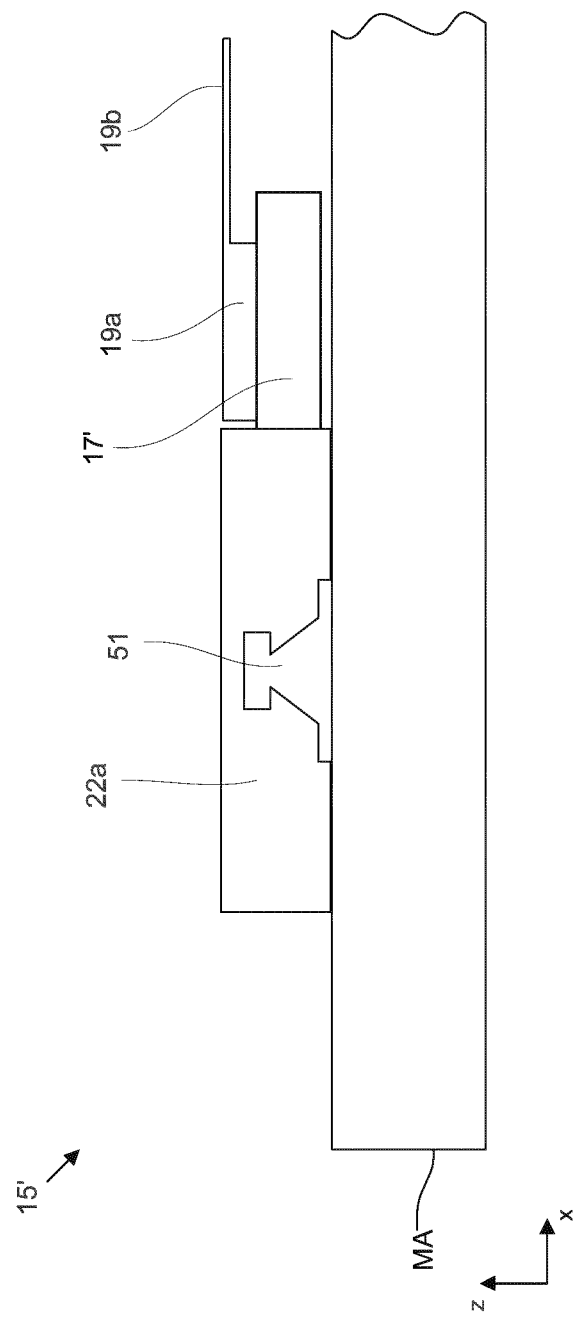
FIG. 5 is another schematic illustration of a known mask assembly.

FIG. 5 is another schematic of a cross section of a portion of the known mask assembly 15' as described above. The cross section shown in FIG. 5 is in a plane perpendicular to the y direction (i.e. perpendicular to the plane of FIG. 4) and through one of the engagement mechanisms 22a and the associated stud 51. The stud 51 is fixed to the patterning device MA using a glue.

Figure 6:
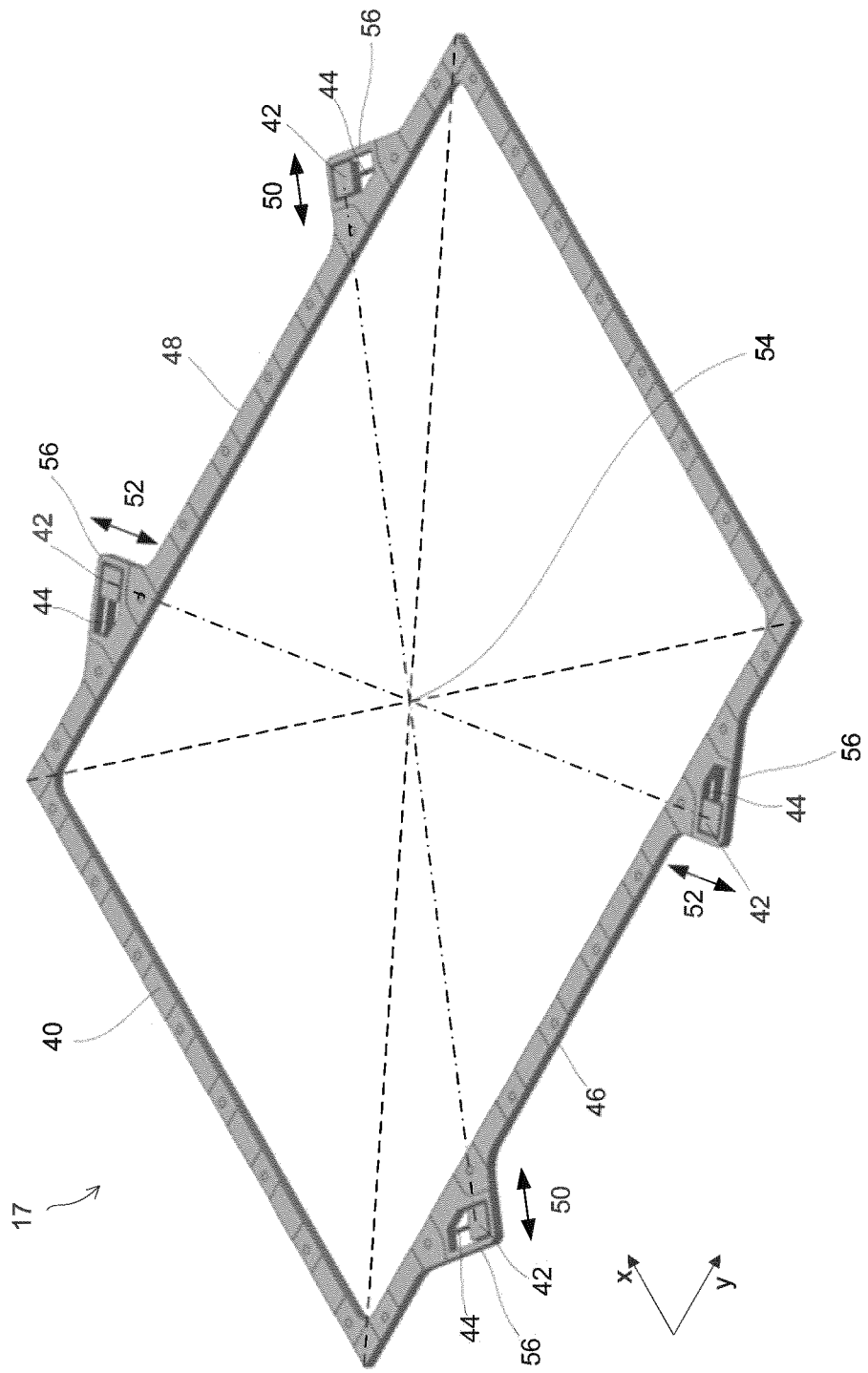
FIG. 6 is a perspective view of a new pellicle frame according to an embodiment of the present invention.

FIG. 6 is a perspective view of a new pellicle frame 17 according to an embodiment of the present invention.

The pellicle frame 17 comprises: a first portion 40, four second portions 42 and four spring portions 44. The first portion 40, four second portions 42 and four spring portions 44 are all integrally formed and are formed from the same material, which may be referred to as a first material. In this embodiments, the first portion 40, four second portions 42 and four spring portions 44 are all formed from a material comprising titanium (for example a titanium alloy). In particular, the first portion 40, four second portions 42 and four spring portions 44 are all formed from titanium (grade 5). Titanium grade 5 may also be referred to as Ti6Al4V, Ti-6Al-4V or Ti 6-4. Titanium grade 5 comprises 6% aluminium (Al), 4% vanadium (V) and traces of iron and oxygen; the remainder comprises titanium.

As will be explained further below, the first portion is for connection to a border 19a of a pellicle 19. The first portion 40 comprises a hollow and generally rectangular body.

As will be explained further below, the four second portions 42 are for connection to a patterning device MA.

Each of the second portions 42 is connected to the first portion 40 by a spring portion 44. Each of the four second portions 42 is proximate on corner of the first portion 40. Two of the second portions 42 are provided on one side 46 of the hollow and generally rectangular member of the first portion 40. The other two of the second portions 42 are provided on an opposite side 48 of the hollow and generally rectangular member of the first portion 40.

Each of the plurality of second portions 42 comprises a generally cuboidal body. In a main plane of the pellicle frame 17 (the x-y plane in FIG. 6) each of the second portions 42 is rectangular. Each of the second portions 42 therefore provides a generally rectangular surface which can be adhered to a surface of a patterning device MA (as discussed further below).

Each of the spring portions 44 is configured so as to allow for some relative movement of the first portion 40 and the second portion 42 that it connects to the first portion in a movement direction, as now described.

Each of the spring portions 44 comprises a generally cuboidal body. In a main plane of the pellicle frame 17 (the x-y plane in FIG. 6) each of the spring portions 44 extends in a connection direction from the first portion 40 to one of the second portions 42. Each spring portion 44 has a smaller dimension in a movement direction 50, 52 which is in the main plane of the pellicle frame 17 and is perpendicular to the connection direction. The movement direction of each spring portion 44 is indicated in FIG. 6 by an arrow 50, 52. Note that, in general, each spring portion 44 may have a different movement direction 50, 52. In this embodiment each pair of diagonally opposed spring portions 44 has the same movement direction 50, 52 such that two spring portions 44 have a first movement direction 50 and two spring portions 44 have a second movement direction 52. Although each of the spring portions 44 comprises a generally cuboidal body, the dimension of this body in the movement direction 50, 52 is significantly smaller than the other two dimensions. In particular, the dimensions of the spring portions 44 are such that the spring portions 44 allow for some relative movement of the second portion 42 and the first portion 40 in the movement direction 50, 52. It will be appreciated that suitable dimensions to achieve this will, in general, be dependent on the elastic properties of the first material (in this example a titanium alloy). In one embodiment, the spring portions 44 may have the following approximate dimensions: width 0.2 mm, length 5.5 mm and height 1.4 mm.

Each spring portion 44 is a relatively thin portion of the first material (from which the first portion 40 and the second portions 42 are formed) which extends from the first portion 40 to one of the second portions 42 in the connection direction. In use, the movement and flexibility which is provided by the spring portions 44 allows flexing of the pellicle frame 17 (and an attached pellicle 19) relative to the patterning device MA which the second portions 42 are connected to. This can accommodate differential thermal expansion of the patterning device MA, the pellicle frame 17 and the pellicle 19. This is advantageous because it reduces potentially damaging thermal stresses arising in the pellicle frame 17 (which may damage the pellicle 19) and the patterning device MA (which may distort the pattern being imaged onto the wafer W). It also reduces the loads on the adhesives which connect the pellicle 19 to the patterning device MA (i.e. an adhesive layer between the first portion 40 of the pellicle frame 17 and the pellicle 19; and an adhesive layer between each of the second portions 42 of the pellicle frame 17 and the patterning device MA).

Furthermore, due to the different materials from which the pellicle 19 and pellicle frame 17 are formed, there may be some differential thermal expansion of the pellicle 19 and pellicle frame 17, which may result in some distortion of the pellicle assembly 16 that these components form. The movement and flexibility which is provided by the spring portions 44 also accommodates such distortions without placing a load on the patterning device MA or any of the adhesives which connect the pellicle 19 to the patterning device MA (or at least reducing any such loads).

The dimensions of the spring portions 44 in a direction perpendicular to the main plane of the pellicle frame 17 are preferably sufficiently large so as to prevent, or at least significantly reduce any relative movement between the first portion 40 and the second portions 42 out of the plane of the pellicle frame (i.e. the z direction in FIG. 6).

Each second portion 42 and the spring portion 44 to which it is connected may be considered to form system which is cantilevered from the first portion 40. Similarly, spring portion 44 and the first portion 40 may be considered to form a system which is cantilevered from the second portion 42 connected to that spring portion 44.

In the main plane of the pellicle frame 17 (the x-y plane in FIG. 6), the dimensions of the second portions 42 may be of the same order as a thickness of the first portion, for example of the order of 5 mm. In the main plane of the pellicle frame 17 (the x-y plane in FIG. 6), the spring portions 44 may have a length that is of the same order as the dimensions of the second portions 42 and the thickness of the first portion, for example of the order of 5 mm. In one embodiment, in the main plane of the pellicle frame 17 (the x-y plane in FIG. 6), the dimensions of the second portions 42 are 4.5 mm by 4.5 mm; the thickness of the first portion is of the order of 3.85 mm; and the length of the spring portions 44 is of the order of 5.5 mm.

In the main plane of the pellicle frame 17 (the x-y plane in FIG. 6), the spring portions 44 may have a width that is of the order of a factor of 20 smaller than its length and the dimensions of the second portions 42 and the thickness of the first portion.

Perpendicular to the main plane of the pellicle frame 17, the dimensions of all parts of the pellicle frame 17 may be approximately equal and may, for example, be of the order of 1.4 mm.

Each of the spring portions 44 is configured so that its movement direction 50, 52 points generally towards a center 54 of the first portion 40. To better illustrate this, a number of straight lines are provided on FIG. 6. Two dashed lines are shown, each extending between diagonally opposed corners of the first portion 40. The intersection point of these two dashed lines is the center 54 of the first portion 40. Also shown is a straight line from a central point on each second portion 42 to the center 54 of the first portion 40. It can be seen that the movement direction 50, 52 of each spring portion 44 points generally towards a center 54 of the first portion 40. This is achieved by orientating each spring portion 44 such that its connection direction (from the first portion 40 to a second portion 42 in the plane of the pellicle frame 17) is perpendicular to the straight line from the central point on that second portion 42 to the center 54 of the first portion 40. This is advantageous because it means that each spring portion 44 allows the pellicle frame 17 and pellicle, in the vicinity of each of the four second portions 42 (i.e. the four positions where it connects to the patterning device MA) to move in a direction that passes through the geometric center 54 of the first potion 40 (and therefore the geometric center of the pellicle assembly). This allows the pellicle frame 17 (and the pellicle assembly) to expand equally in all directions without rotating relative to the patterning device MA, which is beneficial. Therefore, with such an arrangement, if there is uniform heating of the pellicle frame 17 (relative to the temperature of the patterning device MA), the orientation and central position of the pellicle frame 17 relative to the patterning device MA would stay the same. The intersection of the straight lines from the central point on each second portion 42 to the center 54 of the first portion 40 may be considered to be the "starting point" of expansion and, since these lines intersect at one combined point, the system will expand in each direction equally.

Each of the spring portions 44 is configured so that its connection direction (from the first portion 40 to a second portion 42 in the plane of the pellicle frame 17) extends through the central point on that second portion 42.

Each of the second portions 42 is disposed outside of the generally hollow rectangular body of the first portion 40.

The pellicle frame 17 further comprises four side protrusions 56 from first portion 40. The protrusions 56 are also formed from the first material (in this example a titanium alloy). The protrusion 56 are integrally formed with the first portion 40. Each side protrusion 56 together with the first portion 40 defines an aperture and each of the second portions 42 (and its corresponding spring portion 44) is disposed in one of said apertures. That is, each side protrusion 56 together with the first portion 40 forms a frame around one of the second portions 42 (and its corresponding spring portion 44). Each protrusion 56 from the generally rectangular first portion 40 is generally of the form of a hollow triangle. A clearance gap is provided between second portions 42 and the protrusion 56 and/or first portion 40 (as will be described further below with reference to FIG. 7). This clearance gap allows for some limited movement between each second portion 42 and the first portion 40 in a movement direction 50, 52. However, the protrusions 56 have sufficiently large dimensions so as to be substantially rigid. In one embodiment, in a main plane of the pellicle frame 17 (i.e. the x-y plane in FIG. 6), the protrusions 56 may have a thickness of the order of 1 mm. A dimension of the side protrusions 56 in a direction perpendicular to the main plane of the pellicle frame 17 may be substantially the same as that of other parts of the pellicle frame, for example of the order of 1.4 mm. The protrusions 56 therefore act as physical stops to limit the range of movement between each second portion 42 and the first portion 40 in a movement direction 50, 52. Advantageously, this may prevent failure of the spring portions 44. In particular, the protrusions 56 are beneficial in protecting the spring portions 44 against such failure during handling of the pellicle frame 17 (for example during assembly of the pellicle assembly and mask assembly).

The new pellicle frame 17 is advantageous since the first portion 40, the plurality of second portions 42 and the spring portions 44 are all formed from the same material, for example a titanium alloy. This significantly simplifies the manufacture of the pellicle frame 17. For example, all parts of the pellicle frame may be integrally formed together.

This is in contrast to existing arrangements (as described above with reference to FIGS. 2 to 4) whereby a first portion (the known pellicle frame 17') that is for connection to a border 19a of a pellicle 19 is formed from one material (for example silicon) and a plurality of second parts (the engagement mechanisms 22a-22d) which are for connection to a patterning device MA are formed from another material (for example a titanium alloy). Such an existing arrangement is significantly more complicated to manufacture since parts must be made separately and then assembled together (for example in the pellicle attachment apparatus 855). In turn, this significantly increases the cost of manufacturing such an existing pellicle frame assembly 17', 22a-22d (relative to the new pellicle frame 17). This is particularly true since the assembly of these separate parts is not straight forward as a result of the rather strict requirements on a pellicle frame for use in an EUV lithographic apparatus, as explained above with reference to FIG. 2.

First, it is important for the pellicle frame (and a resultant pellicle assembly comprising the pellicle frame) to be clean so as to reduce the risk of contaminating the patterning device (reticle) to which it will be attached in use. For example, it may be desirable to ensure that the number of particles on the pellicle frame is below a desired particle threshold (preferably no particles will be disposed on the pellicle frame). In order to achieve this, the component parts of the known pellicle frame 17' may be maintained in clean environments until they are assembled. The assembly may be achieved in a clean environment. These clean environments may be maintained under vacuum conditions. Maintaining a plurality of clean environments (or a clean environment of increased size) will increase the cost of manufacture. In addition, assembly within the clean environment is challenging.

Second, in use, the pellicle frame will be attached to a reticle that will be supported by a reticle stage. For lithographic apparatus LA referred to as scanners, wherein the patterning device MA and the wafer W are synchronously scanned through an EUV radiation beam, the reticle stage MT, and the pellicle frame attached thereto, will be subject to significant accelerations. It is important that all parts of the moving mask assembly are connected sufficiently well such that they remain connected in spite of these large accelerations. For this reason it may be preferred to reduce the total number of parts which are connected together. The new pellicle frame 17 achieves this.

Although the pellicle frame 17 described above is formed from a titanium alloy, in alternative embodiments different materials may be used. In some embodiments, the material may have a coefficient of thermal expansion (CTE) that is $<10^{-6}$ $K^{-1}$. The material may be elastic. The material may be ductile. In some embodiments, the material may have a Youngs modulus of greater than 100 GPa. In some embodiments, the material may have a density of less than 1500 $kg/m^3$. The material may be suitable for use in vacuum environment. In particular, the material may be suitable for use in the environment within an EUV lithographic apparatus.

Titanium and titanium alloys are suitable for use in vacuum environment and, in particular, it suitable for use in the environment within an EUV lithographic apparatus. In addition, titanium and its alloys are sufficiently elastic to provide the spring portions 44 and to ensure that the pellicle frame 17 is not so brittle that it may break during use.

According to some embodiments of the present invention there may be provided a pellicle assembly 16, comprising the pellicle frame 17 described above and a pellicle 19. According to some embodiments of the present invention there may be provided a mask assembly 15 comprising such a pellicle assembly 16 and a patterning device. An example of such a mask assembly is now described with reference to FIG. 7.

FIG. 7 is a schematic cross section of a portion of the new mask assembly 15. The cross section shown in FIG. 7 is in a plane perpendicular to the y direction and through one of the second portions 42. In this cross section, one of the second portions 42 of the pellicle frame 17 shown in FIG. 6 can be seen. On one side of the second portion 42 (the left hand side in FIG. 7) part of the generally triangular hollow protrusion 56 can be seen. On the other side of the second portion 42 (the right hand side in FIG. 7) another part of the generally triangular hollow protrusion 56 can be seen together with part of the first portion 40 of the pellicle frame. It will be appreciated that the first portion 40 and the protrusion 56 are integrally formed from the same material and therefore there is no boundary between the first portion 40 and the protrusion 56 shown. However, towards the bottom of FIG. 7, labels have been added to show which part corresponds to the first portion 40 and which part corresponds to the protrusion 56.

It can be seen more clearly in FIG. 7 that a clearance gap is provided between second portions 42 and the protrusion 56 and/or first portion 40 (as will be described further below with reference to FIG. 7). This clearance gap allows for some limited movement between each second portion 42 and the first portion 40 in a movement direction 50, 52.

The mask assembly further comprises a pellicle 19 and a patterning device MA.

The pellicle 19 comprises a border portion 19a and a membrane 19b. The border portion 19a is hollow and generally rectangular and surrounds the membrane 19b, which is bounded by the border portion 19a. The the border portion 19a of the pellicle 19 is attached to the first portion 40 of the pellicle frame 17.

The pellicle 19 may of the form of a known pellicle 19 (and may have any features described above with reference to pellicles). As known in the art, the pellicle 19 may be formed by deposition of one or more thin layers of material on a generally rectangular silicon substrate. The silicon substrate supports the one or more thin layers during this stage of the construction of the pellicle 19. Once a desired or target thickness and composition of layers has been applied, a central portion of the silicon substrate is removed by etching (this may be referred to as back etching). A peripheral portion of the rectangular silicon substrate is not etched (or alternatively is etched to a lesser extent than the central portion). This peripheral portion forms the border portion 19a of the final pellicle while the one or more thin layers form the membrane 19b of the pellicle (which is bordered by the border portion 19a).

The border portion 19a of the pellicle 19 is attached to the first portion 40 of the pellicle frame 17 by an adhesive G. The adhesive may, for example, comprise a poly(methyl methacrylate) based adhesive (which may be referred to as PMMA adhesive). Alternatively, the adhesive may be an epoxy adhesive. It will be appreciated that other types of adhesive are also possible. In general, an adhesive may be selected such that outgassing from the adhesive is sufficiently low so as not to contaminate the area and/or is suitable for use with EUV radiation and/or does not impact the performance of the lithographic apparatus and its optics.

Together, the pellicle 19 and the pellicle frame 17 may be considered to form a pellicle assembly 16.

The border portion 19a may be formed from silicon. As explained above, the pellicle frame 17 is typically formed from a more elastic material such as a titanium alloy.

A pellicle 19 generally requires some support from a more rigid pellicle frame 17. The pellicle frame provides two functions: (a) it supports the pellicle 19 and may also tension the pellicle membrane 19b; and (b) it facilitates connection of the pellicle 19 to a patterning device MA. In order to provide some flexibility to allow for different thermal expansion of the pellicle 19 and the reticle MA over the range of operating temperatures that these components experience in use, it is desirable to select a material for the connection to the patterning device which is sufficiently elastic and which is suitable for use in the conditions within an EUV lithographic apparatus. One suitable material comprises titanium. Since a main, hollow rectangular part of the pellicle frame is generally adhered to the border portion, in known assemblies, this main, hollow rectangular part of the pellicle frame is formed from a material whose thermal properties generally match those of the border portion of the pellicle. For example, generally silicon is used. It is for these reasons that known pellicle frames 17' comprise a main silicon body which is glued to the pellicle 19 and four titanium attachment mechanisms 22a-22d that are glued to the side of this main body 17'.

Owing to the very different thermal properties of silicon and titanium (titanium has a thermal expansion coefficient that is approximately four times that of silicon) there is a significant prejudice in the art against using a material for the main body of the pellicle frame that has different thermal properties to those of silicon (such as, for example, titanium or a titanium alloy). The reason for this is that as the temperature of the pellicle assembly varies the differential thermal expansion of the frame and the border would cause the pellicle assembly to warp or buckle. In turn, this may stress the patterning device MA, which may lead to imaging errors such as increased overlay. However, surprisingly, the inventors have found that when using the new pellicle frame 17 overlay is no worse than when using the known pellicle frame 17'. Therefore, the new pellicle frame 17 provides a simpler and less costly arrangement without compromising on imaging performance.

The plurality of second portions 42 of the pellicle frame 17 are attached to the patterning device MA. The second portions 42 of the pellicle frame 17 are attached to the patterning device MA by an adhesive G.

The adhesive may be a poly(methyl methacrylate) based adhesive, which may be referred to as PMMA glue. Material characteristics of the PMMA glue, in particular the elasticity of the PMMA glue and the dimensions in which the PMMA glue may be applied, result in a relatively low deformation of the patterning device MA due to curing of the PMMA glue (as compared to other glues). PMMA glue is more easily removable, and relatively more elastic, than, for example, epoxy glue. Advantageously, this may enable the pellicle assembly 16 to be replaced more easily.

Alternatively, the adhesive may be an epoxy adhesive.

Again, it will be appreciated that other types of adhesive are also possible. In general, an adhesive may be selected such that outgassing from the adhesive is sufficiently low so as not to contaminate the area and/or is suitable for use with EUV radiation and/or does not impact the performance of the lithographic apparatus and its optics.

The new mask assembly 15 is particularly advantageous over known arrangements which typically use intermediate fixing members (known as studs 51) which are affixed to the patterning device MA and which engage with the pellicle assembly 17', as now discussed.

The new mask assembly 15 comprises fewer components than a mask assembly 15' which uses intermediary fixing members such as studs 51 (affixed to a patterning device) and engagement mechanisms 22a-22d (provided on the pellicle assembly 16') to engage with the intermediary fixing members (studs 51). Therefore, advantageously, the new mask assembly 15 is relatively simple to manufacture. The lower number of components and the simpler manufacturing procedure may result in a lower cost of manufacture.

This is particularly true since the assembly of a mask assembly 15 is not straight forward as a result of the rather strict requirements on a mask assembly for use in an EUV lithographic apparatus.

First, it is important for the mask assembly to be clean so as to reduce the risk of contaminating the patterning device (reticle). For example, it may be desirable to ensure that the number of particles on the mask assembly is below a desired particle threshold (preferably no particles will be disposed on the mask assembly). In order to achieve this, the component parts of the mask assembly may be maintained in clean environments until they are assembled. The assembly may be achieved in a clean environment. These clean environments may be maintained under vacuum conditions. Maintaining a plurality of clean environments (or a clean environment of increased size) will increase the cost of manufacture. In addition, assembly within the clean environment is challenging.

Second, in use, the mask assembly will be supported by a reticle stage. For lithographic apparatus referred to as scanners, wherein the patterning device and the wafer are synchronously scanned through an EUV radiation beam, the reticle stage, and the pellicle frame attached thereto, will be subject to significant accelerations. It is important that all parts of the moving mask assembly are connected sufficiently well such that they remain connected in spite of these large accelerations. For this reason it may be preferred to reduce the total number of parts which are connected together. The new mask assembly according to the third aspect of the invention achieves this.

It is estimated that there is a significant reduction in the cost of manufacturing the new mask assembly 15 relative to the cost of manufacturing a known mask assembly 15' of the type described above with reference to FIGS. 2 to 4. For example, the cost of manufacturing the known mask assembly 15' may be of the order of a factor of 10 greater than the cost of manufacturing a new mask assembly 15 of the type shown in FIG. 7.

There are several reasons for this. First the new mask assembly 15 comprises fewer parts than the known mask assembly 15'. Assembly of several parts has a number of associated problems: the assembly should take place in a clean environment and several parts must be accurately aligned under these challenging conditions. Second, some of the parts of the known mask assembly 15' are very expensive to manufacture.

In some embodiments, the separation between the pellicle 19 and the patterning device MA may, for example, be approximately between 1 mm and 10 mm, for example between 1 mm and 5 mm, more preferably between 2 mm and 2.5 mm.

Although in the above-described embodiment the pellicle frame 17 comprises four second portions 42, each connected to the first portion 40 by a spring portion 44, in other embodiments a different number of second portions 42 may be provided, each connected to the first portion 40 by a spring portion 44.

The assembly of the pellicle assembly 16 may be achieved by gluing the pellicle 19 to the pellicle frame 17. This process may share one or more features in common with existing processes for gluing a pellicle 19 to the known pellicle frame 17'.

The gluing of the pellicle 19 to the first portion 40 of the pellicle frame 17 and/or the gluing of the second portions 42 to the patterning device may be achieved using any suitable glue dispenser.

The glue dispenser may comprise a syringe. The syringe may dispense a defined volume of one or more components of the glue. The glue dispenser may comprise a nozzle. For example, the nozzle may be connected to the syringe and one or more components of the glue may be provided using the syringe connected to the nozzle. The glue may be applied with a cylindrical nozzle. The glue may be applied with a tapered nozzle. The glue dispenser may comprise a brush and may apply one or more components of the glue using the brush. The glue dispenser may comprise a sponge and may apply one or more components of the glue using the sponge. The glue dispenser may comprise a printing apparatus (for example, a screen printing apparatus) for providing one or more components of the glue. The glue dispenser may comprise a dispensing apparatus for providing one or more components of the glue as a spray (for example, an aerosol spray dispensing system may be used). It will be appreciated that the glue may be provided in any known manner.

The glue dispenser may provide a glue in multiple components (for example, an accelerator and an initiator of the glue). One component of a glue may have a higher viscosity than another component of a glue. That is, there may be a component of the glue having a relatively high viscosity (a "thick" component) and a component of the glue having a relatively low viscosity (a "thin" component). In an example embodiment, a glue dispenser may dispense a thick component of the glue using a syringe and a nozzle. In an example embodiment, a glue dispenser may dispense a thin component of the glue using a brush, sponge, screen printing apparatus, or aerosol spray dispensing system.

Although the use of glue to attach the pellicle 19 to the pellicle frame 17 is described above, the pellicle may be attached to the pellicle frame using any suitable type of bonding (including without using glue).

Although the use of glue to attach the pellicle frame 17 to the patterning device MA is described above, the pellicle frame 17 may be attached to the patterning device MA using any suitable type of bonding (including without using glue).

References to a mask or reticle in this document may be interpreted as references to a patterning device (a mask or reticle is an example of a patterning device) and the terms may be used interchangeably. In particular, the term mask assembly is synonymous with reticle assembly and patterning device assembly.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A pellicle frame comprising:
   a first portion for connection to a border of a pellicle, the first portion comprising a hollow and generally rectangular body; and
   a plurality of second portions for connection to a patterning device,
   wherein the first portion and the plurality of second portions are all formed from a first material,
   wherein each of the second portions is connected to the first portion by a spring portion formed from the first material, and
   wherein each of the spring portions is configured so as to allow for some respective relative movement between the first portion and the respective second portion when the respective second portion is affixed to the patterning device.

2. The pellicle frame of claim 1, wherein the first material comprises titanium.

3. The pellicle frame of claim 1, wherein there are at least four second portions, each second portion connected to the first portion by a spring portion.

4. The pellicle frame of claim 3, wherein each of the four second portions is proximate to a corner of the first portion.

5. The pellicle frame of claim 3, wherein two of the second portions are provided on one side of the hollow and generally rectangular body of the first portion and two other of the second portions are provided on an opposite side of the hollow and generally rectangular body of the first portion.

6. The pellicle frame of claim 1, wherein each of the plurality of second portions comprises a generally cuboidal body such that in a main plane of the pellicle frame each of the second portions is rectangular.

7. The pellicle frame of claim 1, wherein, in a plane of the pellicle frame, each of the spring portions comprises a portion of the first material extending in a respective connection direction from the first portion to one of the second portions, the respective spring portion having a smaller dimension in a respective movement direction which is in a plane of the pellicle frame and is perpendicular to the respective connection direction so as to allow for the associated some respective relative movement.

8. The pellicle frame of claim 7, wherein each of the spring portions is configured so that its connection direction extends through a central point on the second portion that it is connected to.

9. The pellicle frame of claim 1, wherein each pair of a plurality of pairs of diagonally opposed spring portions has the same movement direction such that two spring portions of one of the pairs have a first movement direction and two spring portions of another of the pairs have a second movement direction.

10. The pellicle frame of claim 1, wherein each of the spring portions is configured so that its movement direction points generally towards a center of the first portion.

11. The pellicle frame of claim 1, further comprising a plurality of side protrusions from the hollow and generally rectangular body, wherein each side protrusion is formed from the first material, and wherein each side protrusion and the hollow and generally rectangular body defines an aperture and wherein each of the plurality of second portions is disposed in one of the apertures.

12. A pellicle assembly, comprising:
the pellicle frame according to claim 1; and
a pellicle, the pellicle comprising a border portion, which is hollow and generally rectangular, and a membrane bounded by the border portion,
wherein the border portion of the pellicle is attached to the first portion of the pellicle frame.

13. The pellicle assembly of claim 12, wherein the border portion of the pellicle is formed from a second material which is different to the first material from which the pellicle frame is formed.

14. The pellicle assembly of claim 13, wherein the border portion of the pellicle is formed from silicon.

15. The pellicle assembly of claim 13, wherein the first material comprises titanium.

16. The pellicle assembly of claim 12, wherein the border portion of the pellicle is attached to the first portion of the pellicle frame by an adhesive.

17. The pellicle assembly of claim 16, wherein the adhesive is a poly (methyl methacrylate) based adhesive.

18. The pellicle assembly of claim 16, wherein the adhesive is an epoxy adhesive.

19. A mask assembly, comprising:
the pellicle assembly according to claim 12; and
a patterning device,
wherein the plurality of second portions of the pellicle frame are attached to the patterning device.

20. The pellicle assembly of claim 19, wherein the plurality of second portions of the pellicle frame are attached to the patterning device by an adhesive.

21. The pellicle assembly of claim 20, wherein the adhesive is a poly (methyl methacrylate) based adhesive.

22. The pellicle assembly of claim 20, wherein the adhesive is an epoxy adhesive.

* * * * *